(12) United States Patent  (10) Patent No.: US 8,421,505 B2
Nakanishi  (45) Date of Patent: Apr. 16, 2013

(54) DRIVE CIRCUIT FOR SEMICONDUCTOR SWITCHING ELEMENT

(75) Inventor: Ryouta Nakanishi, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 404 days.

(21) Appl. No.: 12/785,934

(22) Filed: May 24, 2010

(65) Prior Publication Data

US 2010/0315842 A1  Dec. 16, 2010

(30) Foreign Application Priority Data

Jun. 15, 2009 (JP) ................................. 2009-142229

(51) Int. Cl.
*H03K 3/00* (2006.01)

(52) U.S. Cl.
USPC .......................................... 327/108; 327/110

(58) Field of Classification Search .......... 327/374–377, 327/108–112, 427, 403, 440; 363/98; 307/125
See application file for complete search history.

(56) References Cited

U.S. PATENT DOCUMENTS 5,023,566 A * 6/1991 El-Hamamsy et al. ....... 330/251

FOREIGN PATENT DOCUMENTS

JP  2002-320376  10/2002

OTHER PUBLICATIONS

Office Action issued Apr. 26, 2011 in Japan Application No. 2009-142229 (With Partial English Translation).
U.S. Appl. No. 13/106,219, filed May 12, 2011, Nakanishi.

* cited by examiner

*Primary Examiner* — Thomas J Hiltunen
(74) *Attorney, Agent, or Firm* — Oblon, Spivak, McClelland, Maier & Neustadt, L.L.P.

(57) ABSTRACT

A drive circuit of first and second switches includes a first series circuit having a capacitor and a primary winding of a transformer and connected to both ends of a pulse signal generator, a first secondary winding of the transformer to apply a voltage to a control terminal of the first semiconductor switch based on the pulse signal, the first secondary winding being wound in a direction opposite to the primary winding, a second secondary winding of the transformer to apply a voltage to a control terminal of the second semiconductor switch based on the pulse signal, the second secondary winding being wound in the same direction to the primary winding, and a third semiconductor switch that turns on when the pulse signal is stopped, to shorten an ON period of the first semiconductor switch.

6 Claims, 4 Drawing Sheets

DRIVE CIRCUIT FOR SEMICONDUCTOR SWITCHING ELEMENT

BACKGROUND OF THE INVENTION

1. Field of the Invention

The present invention relates to a drive circuit for alternately turning on first and second semiconductor switching elements that are connected in series.

2. Description of the Related Art

FIG. 1 illustrates an example of a drive circuit for driving semiconductor switching elements according to a related art. In FIG. 1, a first switching element Q1 of an n-type MOSFET for high side and a second switching element Q2 of an n-type MOSFET for low side are connected in series. Both ends of this series circuit are connected to a DC power source VDC. A connection point of the first and second switching elements Q1 and Q2 is connected to a load 1.

The first and second switching elements Q1 and Q2 are controlled according to a control signal, i.e., a pulse signal generated by a pulse signal generator 2. Both ends of the pulse signal generator 2 are connected to a series circuit including a capacitor C and a primary winding P of a transformer T1. The transformer T1 has the primary winding P, a first secondary winding S1, and a second secondary winding S2. The first secondary winding S1 and primary winding P are oppositely wound and the second secondary winding S2 and primary winding P are wound in the same direction.

The first secondary winding S1 of the transformer T1 is connected to a first driver 3c. Based on a voltage provided by the first secondary winding S1, the first driver 3c applies a first drive signal to a gate of the first switching element Q1. The second secondary winding S2 of the transformer T1 is connected to a second driver 3d. Based on a voltage provided by the second secondary winding S2, the second driver 3d applies a second drive signal to a gate of the second switching element Q2.

Operation of the drive circuit illustrated in FIG. 1 will be explained with reference to a waveform diagram of FIG. 2.

At time t0, the pulse signal generator 2 generates a pulse signal PL, which is transferred through the capacitor C and the primary winding P of the transformer T1 to the first and second secondary windings S1 and S2. The first and second secondary windings S1 and S2 are oppositely wound, and therefore, pulse signals that are inverted from each other are sent to the first and second drivers 3c and 3d. The first driver 3c applies the first drive signal Hg to the gate of the first switching element Q1 and the second driver 3d applies the second drive signal Lg to the gate of the second switching element Q2. The waveform diagram of FIG. 2 is based on that the low-side second secondary winding S2 is wound in the same direction as the primary winding P.

When the pulse signal PL is low, the first drive signal Hg is high to turn on the first switching element Q1 to supply power of the DC power source VDC to the load 1. When the pulse signal PL is high, the second drive signal Lg is high to turn on the second switching element Q2 to discharge energy of the load 1.

At time t10, the pulse signal generator 2 stops generation of the pulse signal PL, to stop the drive circuit. At this time, the second secondary winding S2 wound in the same direction as the primary winding P provides a negative output voltage to turn off the second switching element Q2.

On the other hand, the first secondary winding S1 that is oppositely wound to the primary winding P provides a positive output voltage. When this voltage exceeds a threshold voltage Vth of the gate of the first switching element Q1, the first switching element Q1 turns on for a period tON. Thereafter, an excitation inductance L (not illustrated) of the transformer T1 and the capacitor C cause an LC resonance. Due to the consumption of resonant energy, a voltage Vc across the capacitor C gradually decreases.

There is another related art disclosed in Japanese Unexamined Patent Application Publication No. 2002-320376 (Patent Document 1). This related art is a method of driving a power switch element. According to the related art, a switching regulator drives through a drive transformer the power switch element with a pulse signal. When stopping the pulse signal, the related art gradually decreases the duty, i.e., the pulse width of the pulse signal, or the voltage of the pulse signal, thereby protecting the power switch element from being damaged by a voltage free oscillation caused by an inductance of the drive transformer and input and output capacitors.

SUMMARY OF THE INVENTION

During the resonant period in which the LC resonance occurs in the related art of FIGS. 1 and 2, the first secondary winding S1 provides a positive voltage to extend the ON period of the first switching element Q1 and cause an overcurrent.

To solve this problem, the present invention provides a drive circuit for driving semiconductor switching elements according to a pulse signal, capable of preventing an ON period of the switching elements from elongating when the pulse signal is stopped.

According to an aspect of the present invention, the drive circuit for alternately turning on first and second switching elements that are connected in series includes a first series circuit including a capacitor and a primary winding of a transformer and connected to both ends of a pulse signal generator that generates a pulse signal; a first secondary winding of the transformer, configured to generate a voltage based on the pulse signal and apply the voltage to a control terminal of the first switching element, the first secondary winding being wound in a direction opposite to a direction in which the primary winding is wound; a second secondary winding of the transformer, configured to generate a voltage based on the pulse signal and apply the voltage to a control terminal of the second switching element, the second secondary winding being wound in the same direction as the direction in which the primary winding is wound; and a third switching element configured to turn on when generation of the pulse signal is stopped and shorten an ON period of the first switching element.

DESCRIPTION OF THE PREFERRED EMBODIMENT

Drive circuits for driving semiconductor switching elements according to embodiments of the present invention will be explained in detail with reference to the drawings.

Embodiment 1

Figure 3:
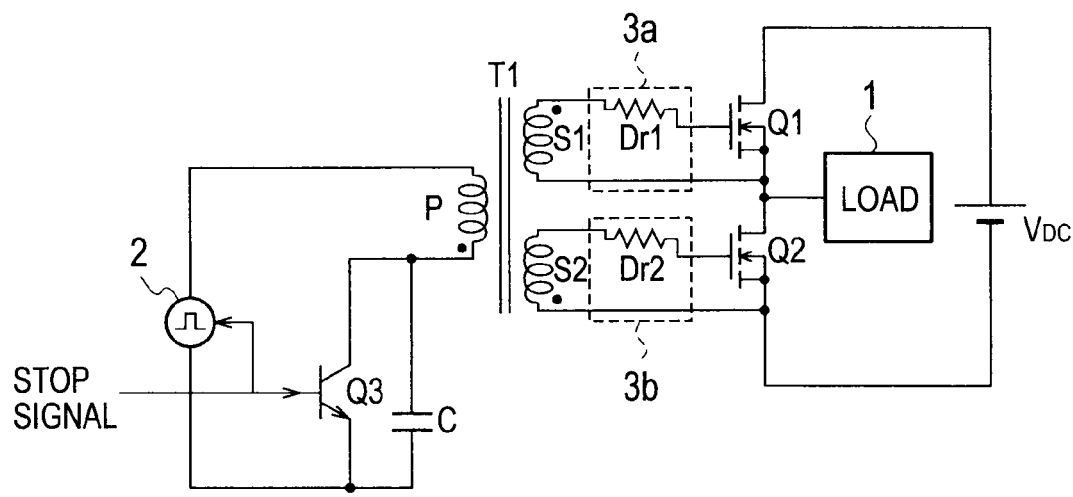
FIG. 3 is a schematic diagram illustrating a drive circuit for driving switching elements according to Embodiment 1 of the present invention.

FIG. 3 is a schematic diagram illustrating a drive circuit for driving semiconductor switching elements according to Embodiment 1 of the present invention. The drive circuit of Embodiment 1 illustrated in FIG. 3 is characterized by a switching element Q3 ("third semiconductor switch" stipulated in the claims) that turns on when a pulse signal from a pulse signal generator 2 is stopped and shortens an ON period of a first switching element Q1 (first semiconductor switch), thereby preventing the ON period of the first switching element Q1 from elongating.

The switching element Q3 is an npn-type bipolar transistor having a collector (first main terminal) connected to a first end of a capacitor C, an emitter (second main terminal) connected to a second end of the capacitor C, and a base to receive a stop signal for stopping the drive circuit.

The switching element Q3 may be a MOSFET or any other semiconductor switch. In FIG. 3, both ends of the pulse signal generator 2 are connected to a series circuit including a primary winding P of a transformer T1, a resistor R (not illustrated), and the capacitor C. It is possible to connect a series circuit including the resistor R and capacitor C between the collector and emitter of the switching element Q3.

In the drive circuit, a first driver 3a has a resistor Dr1 having a first end connected to a first end of a first secondary winding S1 of the transformer T1 and a second end connected to a gate of the first switching element Q1. A second driver 3b has a resistor Dr2 having a first end connected to a first end of a second secondary winding S2 of the transformer T1 and a second end connected to a gate of a second switching element Q2 (second semiconductor switch).

A time constant determined by the resistor Dr1 and an input capacitance (gate-source capacitance) of the first switching element Q1 provides a first dead time. A time constant determined by the resistor Dr2 and an input capacitance (gate-source capacitance) of the second switching element provides a second dead time. The first and second dead times each are a period in which the first and second switching elements Q1 and Q2 are both OFF. These time constants are determined not to simultaneously turn on the first and second switching elements Q1 and Q2.

The resistors Dr1 and Dr2 may be eliminated by adjusting a time constant of the circuit on the primary side of the transformer T1.

Operation of the drive circuit according to Embodiment 1 will be explained with reference to a waveform diagram of FIG. 4.

Figure 1:
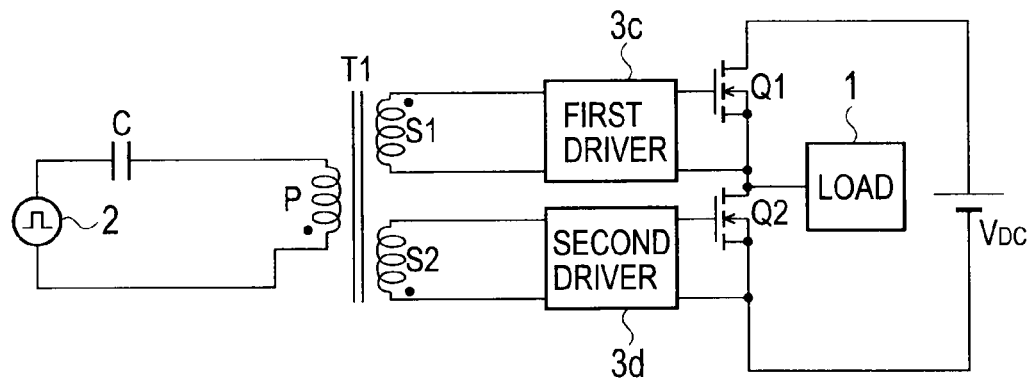
FIG. 1 is a schematic diagram illustrating a drive circuit for driving switching elements according to a related art.
Figure 2:
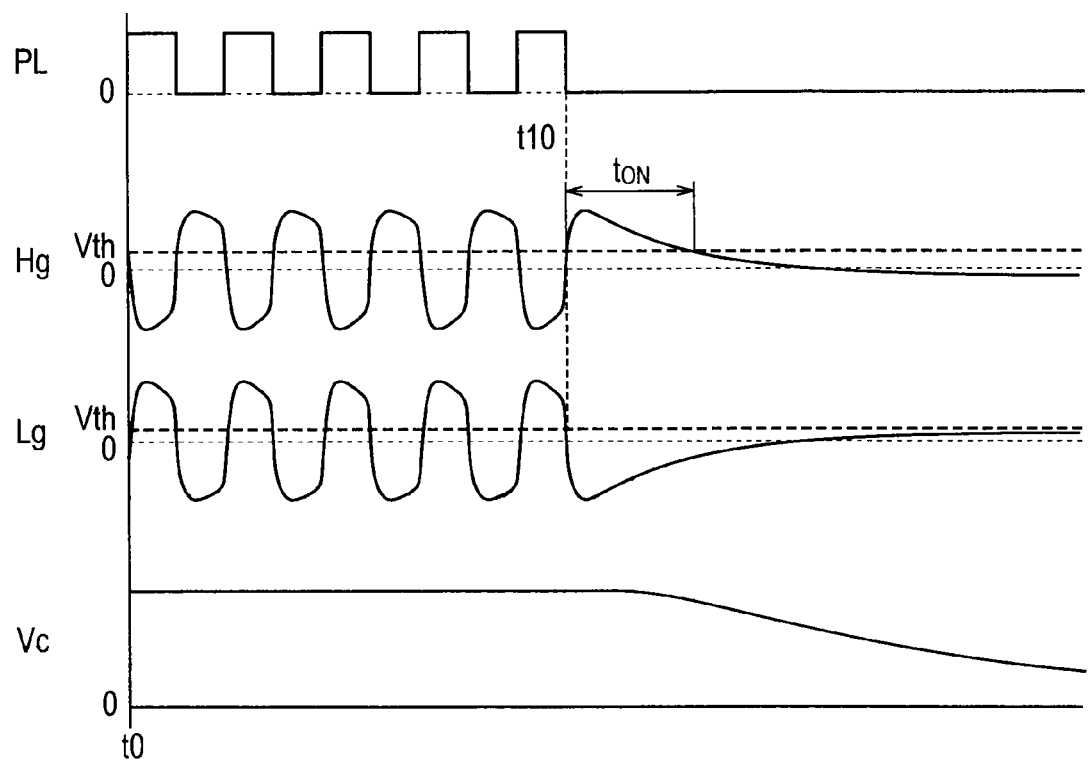
FIG. 2 is a waveform diagram illustrating operation of the drive circuit of FIG. 1.

From time t0 to t1, the stop signal Q3g is low to keep the switching element Q3 off. Namely, operation of Embodiment 1 in the period from t0 to t1 is the same as that of the related art of FIG. 2 in the period from t0 to t10, and therefore, will not be explained.

At time t1, the drive circuit is inoperative and the stop signal Q3g is applied to the base of the switching element Q3 to turn on the switching element Q3. Then, energy accumulated in the capacitor C is discharged through the switching element Q3, to reduce energy transmitted to an excitation inductance L (not illustrated) of the transformer T1.

This causes a sharp drop in energy transmitted to the first secondary winding S1 that is oppositely wound relative to the primary winding P of the transformer T1. As results, an output voltage of the first secondary winding S1 of the transformer T1, i.e., a first drive signal Hg sharply drops below a threshold voltage Vth of the gate of the first switching element Q1, thereby turning off the first switching element Q1.

At time t2, the voltage of the first drive signal Hg becomes nearly zero. At the same time, a voltage Vc across the capacitor C decreases. Consequently, Embodiment 1 prevents the ON period of the first switching element Q1 from elongating when generation of the pulse signal from the pulse signal generator 2 is stopped.

Embodiment 2

Figure 5:
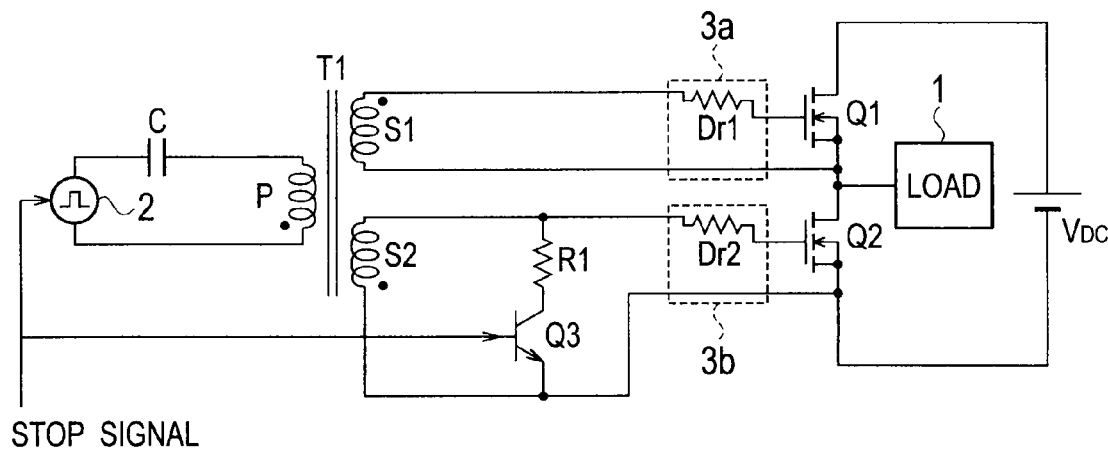
FIG. 5 is a schematic diagram illustrating a drive circuit for driving switching elements according to Embodiment 2 of the present invention.

FIG. 5 is a schematic diagram illustrating a drive circuit for driving semiconductor switching elements according to Embodiment 2 of the present invention. The drive circuit of Embodiment 2 illustrated in FIG. 5 is characterized in that a switching element Q3 for preventing an increase in an ON period is connected in series with a resistor R1 and the series circuit is connected to both ends of a second secondary winding S2 of a transformer T1.

The resistor R1 has a resistance value that is set so that a voltage generated by a first secondary winding S1 of the transformer T1 does not exceed a threshold voltage Vth of a first switching element Q1.

Figure 6:
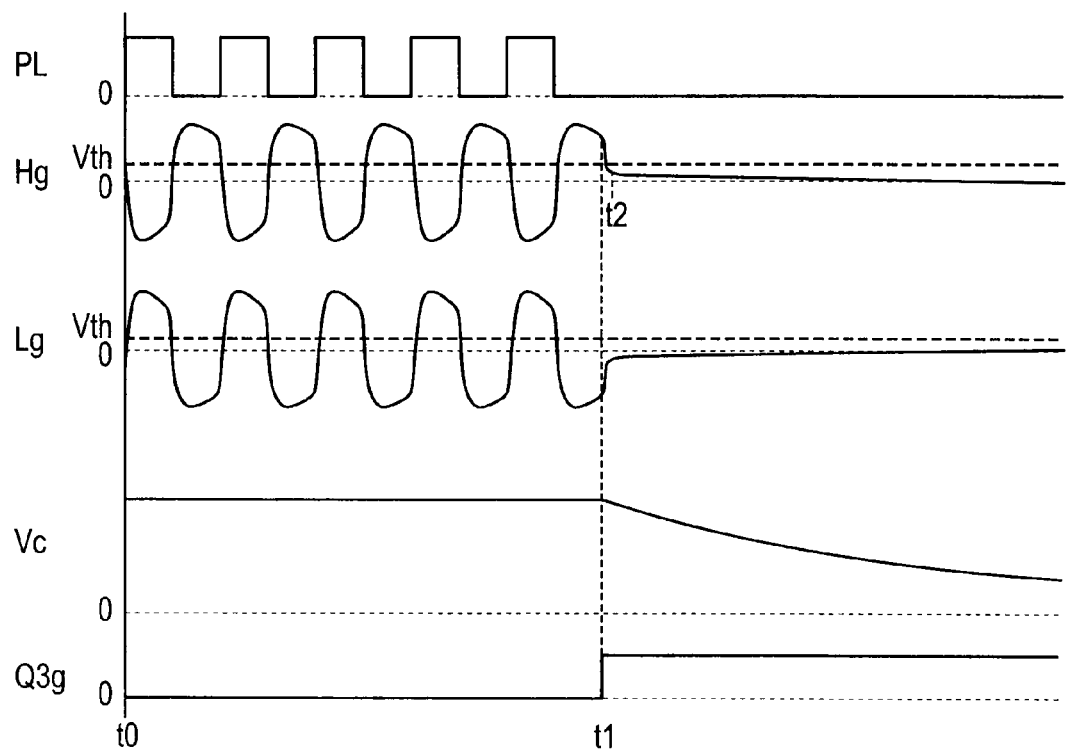
FIG. 6 is a waveform diagram illustrating operation of the drive circuit of FIG. 5.

Operation of the drive circuit according to Embodiment 2 will be explained with reference to a waveform diagram of FIG. 6.

Figure 4:
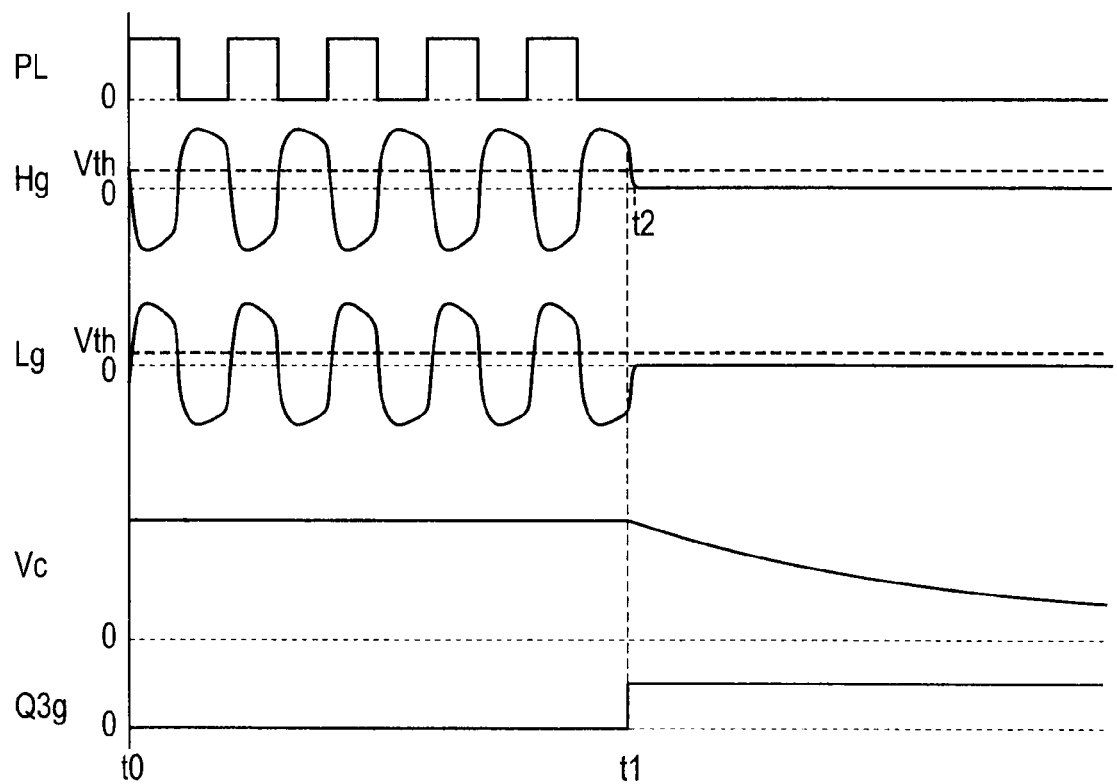
FIG. 4 is a waveform diagram illustrating operation of the drive circuit of FIG. 3.

Operation of the drive circuit in a period from t0 to t1 is the same as that of the drive circuit of Embodiment 1 in the period from t0 to t1 illustrated in FIG. 4, and therefore, will not be explained.

At time t1, the drive circuit becomes inoperative by stopping a pulse signal generator 2 and a stop signal Q3g is applied to a base of the switching element Q3, to turn on the switching element Q3. Then, energy accumulated in the second secondary winding S2 of the transformer T1 is discharged through the switching element Q3 and resistor R1 and is consumed by the resistor R1.

As results, an output voltage of the second secondary winding S2 of the transformer T1, i.e., a second drive signal Lg sharply drops. This results in sharply decreasing an output voltage of the first secondary winding S1 of the transformer T1, i.e., a first drive signal Hg below the threshold voltage Vth of the gate of the first switching element Q1, thereby turning off the first switching element Q1.

At time t2, the voltage of the first drive signal Hg becomes substantially zero. In this way, Embodiment 2 prevents an increase in an ON period of the first switching element Q1 when transmission of a pulse signal from the pulse signal generator 2 is stopped.

Embodiment 3

Figure 7:
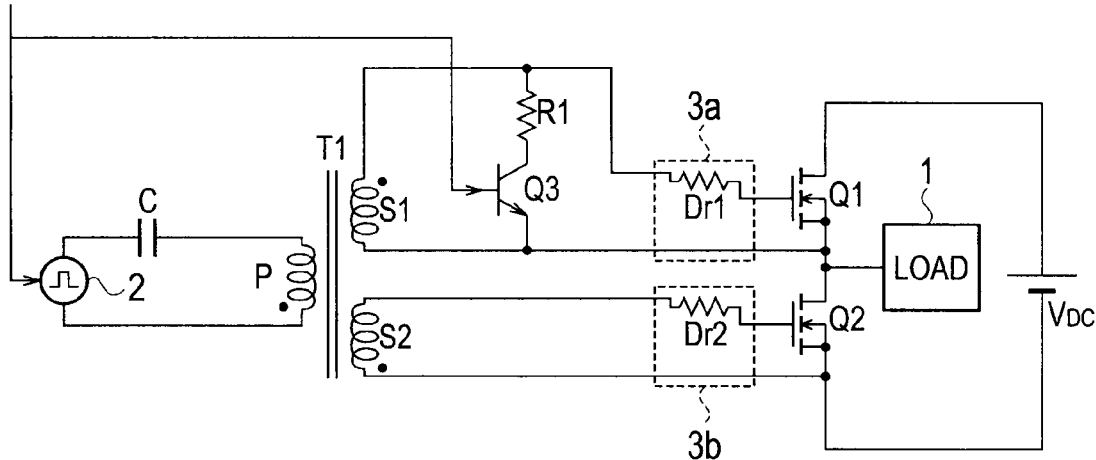
FIG. 7 is a schematic diagram illustrating a drive circuit for driving switching elements according to Embodiment 3 of the present invention.

FIG. 7 is a schematic diagram illustrating a drive circuit for semiconductor switching elements according to Embodiment 3 of the present invention. Embodiment 3 is characterized in that a switching element Q3 for preventing an increase in an ON period is connected in series with a resistor R1 and the series circuit is connected to both ends of a first secondary winding S1 of a transformer T1.

The resistor R1 has a resistance value that is set so that a voltage generated by the first secondary winding S1 of the transformer T1 will not exceed a threshold voltage Vth of a first switching element Q1.

When the drive circuit becomes inoperative by stopping a pulse signal generator 2, a stop signal Q3g is applied to a base of the switching element Q3, to turn on the switching element Q3. Then, energy accumulated in the first secondary winding S1 of the transformer T1 is discharged through the switching element Q3 and resistor R1 and is consumed by the resistor R1.

As results, an output voltage from the first secondary winding S1 of the transformer T1, i.e., a first drive signal Hg sharply drops below the threshold voltage Vth of the gate of the first switching element Q1, thereby turning off the first switching element Q1. In this way, Embodiment 3 prevents an increase in the ON period of the first switching element Q1 when transmission of a pulse signal from the pulse signal generator 2 is stopped.

Embodiment 4

Figure 8:
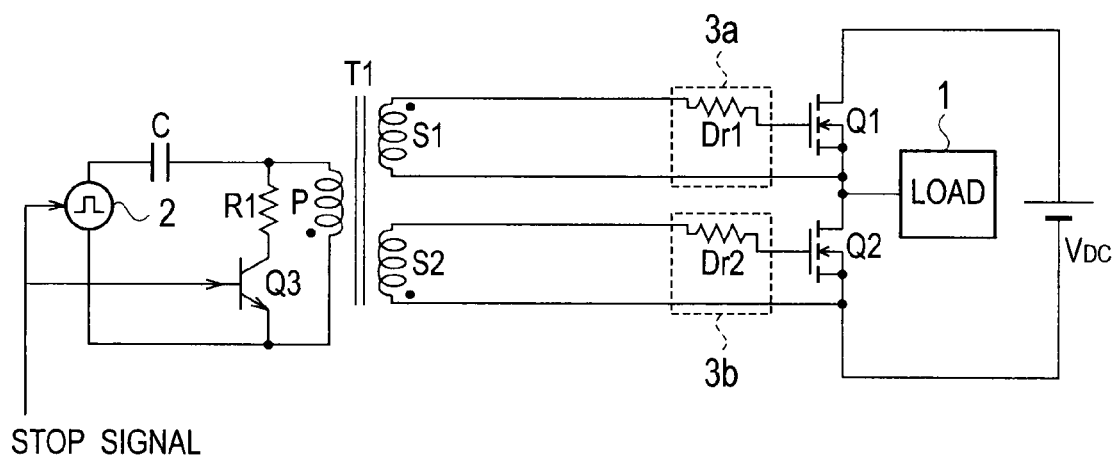
FIG. 8 is a schematic diagram illustrating a drive circuit for driving switching elements according to Embodiment 4 of the present invention.

FIG. 8 is a schematic diagram illustrating a drive circuit for semiconductor switching elements according to Embodiment 4 of the present invention. Embodiment 4 is characterized in that a switching element Q3 for preventing an increase in an ON period is connected in series with a resistor R1 and the series circuit is connected to both ends of a primary winding P of a transformer T1.

The resistor R1 has a resistance value that is set so that a voltage generated by a first secondary winding S1 of the transformer T1 will not exceed a threshold voltage Vth of a first switching element Q1.

When the drive circuit becomes inoperative by stopping a pulse signal generator 2, a stop signal Q3g is applied to a base of the switching element Q3, to turn on the switching element Q3. Then, energy accumulated in the primary winding P of the transformer T1 is discharged through the switching element Q3 and resistor R1 and is consumed by the resistor R1.

This causes a sharp drop in energy transmitted to the first secondary winding S1 that is oppositely wound relative to the primary winding P of the transformer T1. As a result, an output voltage from the first secondary winding S1 of the transformer T1, i.e., a first drive signal Hg sharply drops below the threshold voltage Vth of the gate of the first switching element Q1, thereby turning off the first switching element Q1. In this way, Embodiment 4 prevents the ON period of the first switching element Q1 from elongating when transmission of a pulse signal from the pulse signal generator 2 is stopped.

The present invention is applicable to a lighting apparatus that has a resonant half-bridge converter to light discharge lamps.

As mentioned above, the present invention turns on an ON-period-elongation-preventive switching element when a pulse signal is stopped, to shorten an ON period of a first semiconductor switching element and prevent the ON period of the first semiconductor switching element from elongating.

This application claims benefit of priority under 35 USC §119 to Japanese Patent Application No. 2009-142229, filed on Jun. 15, 2009, the entire contents of which are incorporated by reference herein. Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A drive circuit for alternately turning on first and second semiconductor switches that are connected in series, comprising:
   a first series circuit including a capacitor and a primary winding of a transformer, the capacitor and the primary winding of transformer being connected in series;
   a first secondary winding of the transformer, configured to generate a voltage based on the pulse signal and apply the voltage to a control terminal of the first semiconductor switch, the first secondary winding being wound in a direction opposite to a direction in which the primary winding is wound;
   a second secondary winding of the transformer, configured to generate a voltage based on the pulse signal and apply the voltage to a control terminal of the second semiconductor switch, the second secondary winding being wound in the same direction as the direction in which the primary winding is wound;
   a pulse signal generator connected to both ends of the first series circuit and configured to generate the pulse signal as a control signal of the first and second semiconductor switches for output to the first series circuit; and
   a third semiconductor switch connected in parallel to the capacitor;
   wherein when the drive circuit receives a stop signal, the pulse signal generator stops the generation of the pulse signal and the third semiconductor switch is turned on by the stop signal, thereby an ON period of the first semiconductor switch is shortened.

2. The drive circuit of claim 1, wherein
the third semiconductor switch has first and second main terminals between which the capacitor is connected and a control terminal that receives a stop signal to stop the drive circuit.

3. The drive circuit of claim 1, wherein
the third semiconductor switch has first and second main terminals between which one of the primary, first secondary, and second secondary windings of the transformer is connected and a control terminal that receives a stop signal to stop the drive circuit.

4. The drive circuit of claim 3, further comprising
a second series circuit including the third semiconductor switch and a first resistor, wherein
as the third semiconductor switch receives the stop signal, the first resistor has a resistance in a manner as to suppress a voltage generated by one of the primary, first secondary, and second secondary windings of the transformer that is connected to both ends of the second series circuit, thereby a voltage generated by the first secondary winding of the transformer does not exceed a threshold voltage of the control terminal of the first semiconductor switch.

5. A drive circuit for alternately turning on first and second semiconductor switches that are connected in series, comprising:
   a first series circuit including a capacitor and a primary winding of a transformer, the capacitor and the primary winding of transformer being connected in series;
   a first secondary winding of the transformer, configured to generate a voltage based on the pulse signal and apply the voltage to a control terminal of the first semiconductor switch, the first secondary winding being wound in a direction opposite to a direction in which the primary winding is wound;

a second secondary winding of the transformer, configured to generate a voltage based on the pulse signal and apply the voltage to a control terminal of the second semiconductor switch, the second secondary winding being wound in the same direction as the direction in which the primary winding is wound;

a pulse signal generator connected to both ends of the first series circuit and configured to generate the pulse signal as a control signal of the first and second semiconductor switches for output to the first series circuit; and a third semiconductor switch connected in parallel to one of the primary, first secondary, and second secondary windings of the transformer;

wherein when the drive circuit receives a stop signal, the pulse signal generator stops the generation of the pulse signal and the third semiconductor switch is turned on by the stop signal, thereby an ON period of the first semiconductor switch is shortened.

6. The drive circuit of claim 5, wherein the third semiconductor switch is connected in series with a first resister and both ends of one of the primary, first secondary, and second secondary windings of the transformer;

and wherein as the third semiconductor switch receives the stop signal, the first resistor has a resistance in a manner as to suppress a voltage generated by one of the primary, first secondary, and second secondary windings of the transformer, thereby a voltage generated by the first secondary winding of the transformer does not exceed a threshold voltage of the control terminal of the first semiconductor switch.

* * * * *